United States Patent
Oomori et al.

(10) Patent No.: US 6,815,144 B2
(45) Date of Patent: Nov. 9, 2004

(54) POSITIVE-WORKING CHEMICAL-AMPLIFICATION PHOTORESIST COMPOSITION

(75) Inventors: Katsumi Oomori, Beaverton, OR (US); Hiroto Yukawa, Livingston (GB); Ryusuke Uchida, Hillsboro, OR (US); Kazufumi Sato, Sagamihara (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 161 days.

(21) Appl. No.: 10/059,236

(22) Filed: Jan. 31, 2002

(65) Prior Publication Data

US 2002/0090571 A1 Jul. 11, 2002

Related U.S. Application Data

(63) Continuation-in-part of application No. 09/291,116, filed on Apr. 14, 1999.

(30) Foreign Application Priority Data

Apr. 23, 1998 (JP) ............................................ 10-113586

(51) Int. Cl.$^7$ ............................. G03C 1/73; G03F 7/039
(52) U.S. Cl. .................... 430/270.1; 430/326; 430/905; 430/910; 430/914; 430/921; 430/925
(58) Field of Search ............................. 430/270.1, 914, 430/921, 925, 905, 909, 910, 326

(56) References Cited

U.S. PATENT DOCUMENTS

| | | | |
|---|---|---|---|
| 4,968,575 A | 11/1990 | Matsumura et al. | 430/110 |
| 5,057,392 A | 10/1991 | McCabe et al. | 430/109 |
| 5,585,220 A | 12/1996 | Breyta et al. | 430/270.1 |
| 5,658,706 A | 8/1997 | Niki et al. | 430/270.1 |
| 5,679,495 A | 10/1997 | Yamachika et al. | 430/270.1 |
| 5,847,218 A | 12/1998 | Ohsawa et al. | 430/270.1 |
| 5,852,128 A | 12/1998 | Padmanaban et al. | 430/270.1 |
| 5,861,231 A | 1/1999 | Barclay et al. | 430/270.1 |
| 5,955,240 A | 9/1999 | Sato et al. | 430/270.1 |
| 6,103,447 A | 8/2000 | Chen et al. | 430/270.1 |
| 6,387,587 B1 * | 5/2002 | Oomori et al. | 430/270.1 |

FOREIGN PATENT DOCUMENTS

| | | |
|---|---|---|
| EP | 0 507 373 | 10/1992 |
| JP | 10-7650 | 1/1998 |
| WO | WO 97/49006 | 12/1997 |

OTHER PUBLICATIONS

Derwent Publications, AN 1991-083437, XP-002195751, JP 3-028857, Feb. 7, 1991.
Derwent Publications, AN 1998-034031, XP-002195846, JP 62-295068, Dec. 22, 1987.

* cited by examiner

Primary Examiner—Cynthia H. Kelly
Assistant Examiner—Sin J. Lee
(74) Attorney, Agent, or Firm—Wenderoth, Lind & Ponack LLP

(57) ABSTRACT

Disclosed is a novel positive-working chemical-amplification photoresist composition capable of giving an extremely finely patterned resist layer in the manufacturing process of semiconductor devices. The photoresist composition comprises: (A) 100 parts by weight of a copolymeric resin consisting of from 50 to 85% by moles of (a) hydroxyl group-containing styrene units, from 15 to 35% by moles of (b) styrene units and from 2 to 20% by moles of (c) acrylate or methacrylate ester units each having a solubility-reducing group capable of being eliminated in the presence of an acid; and (B) from 1 to 20 parts by weight of a radiation-sensitive acid-generating agent which is an iodonium salt containing a fluoroalkyl sulfonate ion having 3 to 10 carbon atoms as the anion such as bis(4-tert-butylphenyl) iodonium nonafluorobutane sulfonate.

11 Claims, No Drawings

POSITIVE-WORKING CHEMICAL-AMPLIFICATION PHOTORESIST COMPOSITION

This is a continuation-in part application from a co-pending U.S. patent application Ser. No. 09/291,116 filed Apr. 14, 1999.

BACKGROUND OF THE INVENTION

The present invention relates to a positive-working chemical-amplification photoresist composition or, more particularly, to a positive-working chemical-amplification photoresist composition capable of giving a very finely patterned resist layer on a substrate surface by patterning exposure using a KrF excimer laser beam.

As a trend in the manufacturing technology of semiconductor devices and liquid crystal display panels in recent years, extensive investigations are now under way to establish a photolithographic patterning process of a resist layer having a pattern resolution of as fine as 0.25 $\mu$m or even finer by the use of a positive-working chemical-amplification photoresist composition. Turning now to the problem of the light source for the pattern-wise exposure of the photoresist layer to comply with the requirement in the manufacture of semiconductor devices to accomplish finer and finer patterning, a photolithographic patterning technology for obtaining a patterned resist layer of 0.15 to 0.22 $\mu$m fineness by using a KrF excimer laser beam is the current target of the development works.

With an object to comply with the above mentioned requirements, a proposal is made in Japanese Patent. Kokai 7-209868 for a positive-working chemical-amplification photoresist composition containing, as the film-forming resinous ingredient, a copolymeric resin consisting of hydroxyl group-containing styrene units, styrene units and tert-butyl (meth)acrylate units in a molar ratio of 40:20:40 or 33:17:50. The there proposed photoresist composition using a copolymeric resin with a relatively small amount of the hydroxyl group-containing styrene units or a relatively large amount of the tert-butyl (meth)acrylate units is not quite satisfactory when an extremely fine patterned resist layer of 0.15 to 0.22 $\mu$m fineness is formed therewith because the cross sectional profile of the patterned resist layer is not fully orthogonal as desired.

In recent years, on the other hand, onium salts or, in particular, those containing sulfonate ions as the anion are highlighted as an acid-generating agent used in positive-working chemical-amplification photoresist compositions. Examples of such an onium salt as the acid-generating agent in a positive-working chemical-amplification photoresist composition heretofore proposed include salts formed from a bis(4-tert-butylphenyl) iodonium cation and an anion selected from the group consisting of camphor sulfonate ions, 4-methyl-benzene sulfonate ions and trifluoromethane sulfonate ions as disclosed in Japanese Patent Kokai 9-179302 and onium salts containing a fluoroalkyl sulfonate ion and having at least one acid-instabilized group on a phenyl group in the molecule such as 2,2,2-trifluoroethane sulfonic acid (4-tert-butoxyphenyl) diphenyl sulfonium as disclosed in Japanese Patent Kokai 10-7650.

These acid-generating agents, however, are not quite satisfactory with various disadvantages. For example, the onium salts having a camphor sulfonate ion or 4-methylbenzene sulfonate ion as the anion have a relatively low solubility in the organic solvent for the photoresist compositions so that the photoresist composition cannot be compounded with a sufficiently large amount of the onium salt not to impart the photoresist with high photosensitivity. In addition, the stability of the photoresist solution containing the same cannot be high enough and, due to the large molecular size of the compound, the distance of diffusion of the molecules in the post-exposure baking treatment is necessarily riot so large affecting the resolution in patterning. On the other hand, the molecular size of the trifluoromethane sulfonate ions is too small with an excessively large distance of diffusion to cause a defect in patterning such as thinning of the resist pattern.

Further, the onium salts having an acid-instabilizable group and containing a fluoroalkyl sulfonate ion in the molecule are defective due to their low solubility in the organic solvent of the photoresist solutions to limit the amount thereof in the photoresist solution resulting in a decreased photosensitivity and low storage stability of the photoresist solution. In addition, the acid-instabilizable group is liable to be decomposed when the pre-exposure baking treatment or, namely, heat-drying of the photoresist layer formed by coating is performed at 120° C. or higher eventually to lose the activity as an acid-generating agent.

Besides the above, it is known that bis(4-tert-butylphenyl) iodonium nonafluorobutane sulfonate can be used as the acid-generating agent in a photoresist composition for exposure with an ArF excimer laser beam of 193 nm wavelength. It is not certain at all, however, whether or not good results can be obtained when the above mentioned acid-generating agent is used in a photoresist composition for exposure with a KrF excimer laser beam because of the difference in the resinous base ingredient of the composition which is an acrylic resin or a copolymeric resin of a cyclic olefin monomer and maleic anhydride in the former photoresist composition and a copolymeric resin of styrene, $\alpha$-methyl styrene and a (meth)acrylate ester monomer in the latter photoresist composition.

SUMMARY OF THE INVENTION

The present invention accordingly has an object to provide a novel positive-working chemical-amplification photo-resist composition capable of giving a patterned resist layer having an excellently orthogonal cross sectional profile with high photosensitivity and pattern resolution by the pattern-wise exposure with a KrF excimer laser beam.

Thus, the positive-working chemical-amplification photoresist composition provided by the present invention is a uniform blend which comprises:

(A) 100 parts by weight of a copolymeric resin consisting of (a) from 50 to 85% by moles of hydroxyl group-containing styrene units, (b) from 15 to 35% by moles of styrene units and (c) from 2 to 20% by moles of acrylate or methacrylate ester units each having a solubility-reducing group capable of being eliminated in the presence of an acid, the total of the molar fractions of the monomeric units (a), (b) and (c) being 100%; and (B) from 1 to 20 parts by weight of a radiation-sensitive acid-generating agent which is an iodonium salt containing a fluoroalkyl sulfonate ion having 3 to 10 carbon atoms as the anion.

In particular, the above mentioned solubility-reducing group capable of being eliminated in the presence of an acid forming the (meth)acrylate ester units in the component (A) is selected preferably from the group consisting of tertiary alkyl groups, 1-alkoxyalkyl groups and acetal groups. Further, the anion forming the iodonium salt as the component (B) is preferably a nonafluorobutane sulfonate ion.

DETAILED DESCRIPTION OF THE PREFERRED EMBODIMENTS

The base ingredient as the component (A) in the inventive photoresist composition is a ternary copolymeric resin consisting of three kinds of the monomeric units including (a) from 50 to 85% by moles of hydroxyl group-containing styrene units, (b) from 15 to 35% by moles of styrene units and (c) from 2 to 20% by moles of acrylate or methacrylate ester units each having a solubility-reducing group capable of being eliminated in the presence of an acid, the total of the molar fractions of the monomeric units (a), (b) and (c) being 100%. In this ternary copolymeric resin as the component (A), the first monomeric unit (a) is a unit derived from a styrene monomer having at least one hydroxyl group in the molecule in order to impart the copolymeric resin with good solubility in an aqueous alkaline solution as the developer solution. Examples of such a monomeric unit include a hydroxystyrene unit and α-methyl hydroxystyrene unit.

The third monomeric unit (c) in the copolymeric resin has a carboxyl group protected by a group capable of exhibiting a reducing effect on the solubility of the resin in an aqueous alkaline solution while this protective group is eliminated from the carboxyl group by the interaction with an acid generated from the acid-generating agent as the component (B) when the photoresist layer is exposed pattern-wise to actinic rays to release a carboxylic acid increasing the solubility of the resin in an aqueous alkaline solution to give a patterned resist layer in the development treatment with an aqueous alkaline developer solution.

The solubility-reducing group capable of being eliminated in the presence of an acid in the monomeric units of the third class (c) can be any one of known protective groups either singly or as a combination of two kinds or more including tertiary alkyl groups such as tert-butyl and tert-pentyl groups, 1-alkoxyalkyl groups such as 1-ethoxyethyl and 1-methoxypropyl groups and acetal groups such as tetrahydro-furanyl and tetrahydropyranyl groups as preferable ones.

The monomeric unit of the third class (c) is a unit introduced by the copolymerization of a (meth)acrylate ester monomer. This monomeric unit is represented by the general formula

in which R is a hydrogen atom or a methyl group and A is the acid-dissociable solubility-reducing group including tertiary alkyl groups such as tert-butyl group and tert-pentyl group, 1-alkoxyalkyl groups such as 1-ethoxyethyl group and 1-methoxypropyl group and acetal groups such as tetrahydro-pyranyl group and tetrahydrofuranyl group, of which tert-butyl group, 1-ethoxyethyl group and tetrahydropyranyl group are preferred.

The monomeric unit of the third class (c) is preferably a unit derived from a monomer compound selected from the group consisting of tert-butyl (meth)acrylate, 1-ethoxyethyl (meth)acrylate and tetrahydropyranyl (meth)acrylate in respect of the high susceptibility to acid-induced dissociation to give a patterned resist layer having an excellent cross sectional profile. The copolymeric resin as the component (A), which consists of the monomeric units of the three classes (a), (b) and (c) in a specified molar proportion, is advantageous as compared with a resin having solubility-reducing groups introduced into a part of the monomeric units of al poly-hydroxystyrene resin in respect of the larger solubility-reducing effect and smaller thickness reduction of the resist layer by a development treatment in the unexposed areas to give a patterned resist layer having a good cross sectional profile.

In the inventive photoresist composition comprising the copolymeric resinous ingredient as the component (A), which can be either one or a combination of two kinds or more of copolymeric resins falling within the definition of the above described ternary copolymeric resins, it is preferable that the component (A) is a combination of a first copolymeric resin consisting of from 62 to 68% by moles of the monomeric units of the first class (a), from 15 to 25% by moles of the monomeric units of the second class (b) and from 12 to 18% by moles of the monomeric units of the third class (c) and a second copolymeric resin consisting of from 62 to 68% by moles of the monomeric units of the first class (a), from 25 to 35% by moles of the monomeric units of the second class (b) and from 2 to 8% by moles of the monomeric units of the third class (c) in a weight proportion in the range from 9:1 to 5:5 or, more preferably, from 8:2 to 6:4 in respect of the superiority in the photosensitivity, pattern resolution and orthogonality of the cross sectional profile of the patterned resist layer.

It is preferable that the copolymeric resin as the component (A) has a weight-average molecular weight in the range from 3000 to 30000 as determined by the gel permeation chromatographic (GPC) method by making reference to known polystyrene resins. When the weight-average molecular weight of the component (A) is too low, the photoresist composition cannot be fully film-forming while, when the weight-average molecular weight of the resin is too high, the resin cannot be fully soluble in an aqueous alkaline solution.

The component (B) contained in the inventive photoresist composition in combination with the above described component (A) is a radiation-sensitive acid-generating agent which is a compound capable of releasing an acid by decomposition under irradiation with actinic rays such as ultraviolet light. It is preferable that the acid-generating agent in the inventive photoresist composition is an onium salt compound containing a fluoroalkyl sulfonate ion of 3 to 10 carbon atoms as the anion.

The cation as the counter ion of the above mentioned anion of the onium salt compound is selected from the group consisting of iodonium cations and sulfonium cations, of which iodonium cations are preferred in respect of the advantages of high pattern resolution and small proximity effect enabling formation of a variety of line-and-space patterns having different line widths and space widths. Suitable cations include, for example, phenyl iodonium and sulfonium ions which may optionally be substituted by a lower alkyl group such as methyl, ethyl, propyl, n-butyl and tert-butyl groups or a lower alkoxy group such as methoxy and ethoxy groups.

On the other hand, the anion of the onium salt compound is a fluoroalkyl sulfonate ion obtained by substituting fluorine atoms for a part or all of the hydrogen atoms in an alkyl group of 3 to 10 carbon atoms. It is preferable that the alkyl group in the fluoroalkyl sulfonate ion has 3 to 5 carbon atoms and all of the hydrogen atoms thereof are replaced with fluorine atoms since the acid strength of the sulfonate ion as a sulfonic acid is decreased as the chain length of the alkyl group is increased and the degree of fluorination of the alkyl group is decreased.

Examples of suitable onium salt compounds as the component (B) include: iodonium salt compounds represented by the general formula

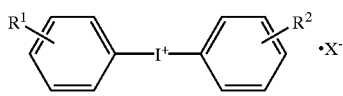

in which $R^1$ and $R^2$ are each, independently from the other, a hydrogen atom, alkyl group having 1 to 4 carbon atoms or alkoxy group having 1 or 2 carbon atoms and $X^-$ is a fluoroalkyl sulfonate ion of 3 to 10 carbon atoms; and sulfonium salt compounds represented by the general formula

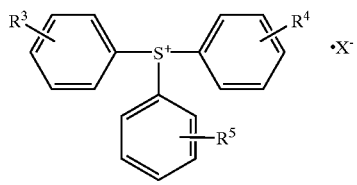

in which $R^3$, $R^4$ and $R^5$ are each, independently from the others, a hydrogen atom, alkyl group having 1 to 4 carbon atoms or alkoxy group having 1 or 2 carbon atoms and $X^-$ has the same meaning as defined above.

Particular examples of the onium salt compounds suitable as the component (B) in the inventive photoresist composition include diphenyl iodonium nonafluorobutane sulfonate, bis(4-tert-butylphenyl) iodonium nonafluorobutane sulfonate, triphenyl sulfonium nonafluorobutane sulfonate and tri(4-methylphenyl) sulfonium nonafluorobutane sulfonate, of which bis(4-tert-butylphenyl) iodonium nonafluorobutane sulfonate is particularly preferable although any of the above named onium salt compounds can be used either singly or as a combination of two kinds or more according to need.

The amount of the onium salt compound as the component (B) in the inventive photoresist composition is in the range from 1 to 20 parts by weight per 100 parts by weight of the component (A). When the amount of the component (B) is too small, good pattern formation can hardly be accomplished while, when the amount of the component (B) is too large, a photoresist composition in the form of a uniform solution cannot be obtained due to the limited solubility of the compound in an organic solution.

While the essential ingredients in the inventive photoresist composition are the above described components (A) and (B), it is optional, if necessary with an object to improve the fidelity of the resist pattern to the photomask pattern by preventing diffusion of the acid released by pattern-wise exposure of the resist layer to actinic rays more than necessary, that the photoresist composition further contains a secondary or tertiary amine compound as a component (C). Examples of preferable secondary amine compounds include aliphatic secondary amines such as diethylamine, dipropylamine, dibutylamine and dipentylamine. Examples of preferable tertiary amine compounds include aliphatic tertiary amines such as trimethylamine, triethylamine, tripropylamine, tributylamine, tripentylamine, N,N-dimethyl propylamine and N-ethyl-N-methyl butylamine, aliphatic tertiary alkanolamine compounds such as N,N-dimethyl monoethanolamine, N,N-diethyl monoethanolamine and triethanolamine and aromatic tertiary amine compounds such as N,N-dimethylaniline, N,N-diethyl-aniline, N-ethyl-N-methylaniline, N,N-dimethyltoluidine, N-methyl diphenylamine, N-ethyl diphenylamine and triphenylamine, of which aliphatic tertiary $C_2$ to $C_4$ alkanolamine compounds such as triethanolamine are particularly preferable although any of these amine compounds can be used either singly or as a combination of two kinds or more according to need.

While additional admixture of the above mentioned amine compound with the inventive photoresist composition may eventually cause a disadvantage of a decrease in the photosensitivity of the composition, this disadvantage can be overcome, along with a beneficial effect of improving the pattern resolution, by the admixture of a carboxylic acid, a phosphorus-containing oxo acid compound or a derivative thereof as a component (D) in combination with the component (C). Preferable carboxylic acids suitable for this purpose include aliphatic saturated carboxylic acids, alicyclic carboxylic acids and aromatic carboxylic acids.

Examples of suitable aliphatic saturated carboxylic acids include butyric, isobutyric, malonic, succinic, glutaric and adipic acids. Examples of suitable alicyclic carboxylic acids include 1,1-cyclohexane dicarboxylic acid, 1,2-cyclohexane dicarboxylic acid, 1,3-cyclohexane dicarboxylic acid, 1,4-cyclohexane dicarboxylic acid and cyclohexane 1,1-diacetic acid. Examples of suitable aromatic carboxylic acids include aromatic monocarboxylic acids having a hydroxyl or nitro group as a substituent group and aromatic polycarboxylic acids such as 2-, 3- and 4-hydroxy benzoic acids, 2-hydroxy-3-nitro benzoic acid, phthalic acid, terephthalic acid and isophthalic acid. These carboxylic acids can be used either singly or as a combination of two kinds or more according to need, although the aromatic carboxylic acids are preferable due to the adequate acid strength thereof and 2-hydroxy benzoic acid is more preferable because this compound has high solubility in the organic solvent for the photoresist composition and a patterned resist layer of high quality can be formed on substrates of various materials from the photoresist composition containing this acid.

Examples of the above mentioned phosphorus-containing oxo acids or a derivative thereof include phosphoric acid, di(n-butyl) phosphate, diphenyl phosphate, phosphonic acid, dimethyl phosphonate, di(n-butyl) phosphonate, phenylphosphonic acid, diphenyl phosphonate, dibenzyl phosphonate, phosphinic acid and phenylphosphinic acid as well as esters thereof, of which phenylphosphonic acid is particularly preferable.

As to the amount of the optional component (C) in the inventive photoresist composition, the amine compound is added to the composition in an amount in the range from 0.001 to 10 parts by weight or, preferably, from 0.01 to 1.0 part by weight per 100 parts by weight of the component (A). Addition of the component (C) in an adequate amount to the inventive photoresist composition has an effect of preventing more than necessary diffusion of the acid generated by exposure of the resist layer to actinic rays so as to improve the fidelity of the resist pattern to the photomask pattern.

The amount of the carboxylic acid as the component (D), when added to the inventive photoresist composition, is in the range from 0.001 to 10 parts by weight or, preferably, from 0.01 to 1.0 part by weight per 100 parts by weight of the component (A). Addition of the component (D) to the inventive photoresist composition has an effect of preventing a decrease in the photosensitivity of the composition as a side effect of the component (C) along with a further improvement of the pattern resolution.

It is usual and advantageous that the positive-working chemical-amplification photoresist composition of the present invention is employed in photolithographic patterning works in the form of a uniform solution prepared by dissolving the essential and optional ingredients in an organic solvent. Examples of suitable organic solvents include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate, which can be used either singly or as a mixture of two kinds or more according to need.

It is of course optional that the photoresist composition of the invention is further admixed with various kinds of known additives used conventionally in photoresist compositions including auxiliary resins to improve the properties of the resist layer as a film, plasticizers, stabilizers, coloring agents, surface active agents and others each in a limited amount.

The patterns of the photolithographically formed patterned resist layers in the semiconductor technology can be classified into three types including (1) a line-and-space pattern which is an alternate repetition of parallel lines and parallel spaces each having the same width as the others, (2) a hole pattern to form a contact hole and (3) an isolated pattern which is a repetition of lines and spaces, the spaces each having a width larger than the width of each line.

It is extremely difficult in the prior art to accomplish an ultrafinely patterned resist layer including the above mentioned three types of patterns (1), (2) and (3) simultaneously with fineness of 0.15 to 0.22 μm so that it is becoming more and more important to develop a photoresist composition to meet the requirements in the respective applications. Under these circumstances, the present invention provides a positive-working photoresist composition capable of particularly satisfying the requirements for patterning of a line-and-space pattern and a hole pattern having fineness of 0.20 to 0.22 μm.

In practicing the photolithographic patterning work by using the inventive photoresist composition to obtain an extremely fine line-and-space pattern or hole pattern of the above mentioned fineness, it is preferable, in order to adequately control the diffusing distance of the acid generated by exposure of the resist layer to light, that the coating layer of the photoresist composition on a substrate surface is subjected to a pre-exposure baking treatment or drying treatment after coating and to a post-exposure baking treatment or baking treatment after pattern-wise exposure to light under the following conditions. Namely, the pre-exposure baking treatment is conducted at a temperature in the range from 120 to 140° C. or, preferably, from 130 to 140° C. and the post-exposure baking treatment is conducted at a temperature in the range from 110 to 130° C. with the proviso that the pre-exposure baking temperature is higher than the post-exposure baking temperature, desirably, by at least 10° C.

When the desired resist pattern is a hole pattern, in particular, it is advantageous that the photoresist composition is admixed with dimethylacetamide in an amount of 0.1 to 5.0% by weight based on the amount of the component (A).

The procedure of the photolithographic patterning work by using the inventive photoresist composition is not particularly different from conventional procedures known in the technology of photolithography. It is advantageous that the surface of the substrate such as a semiconductor silicon wafer is subjected beforehand to a treatment with hexamethyl disilazane and the like to improve adhesion of the resist layer to the substrate surface. The photoresist composition in the form of a solution is uniformly applied to the substrate surface on a coating machine such as a spinner followed by drying to form a dried photoresist layer which is pattern-wise exposed to actinic rays such as KrF excimer laser beams through a photomask bearing a desired pattern, for example, on a minifying projection exposure machine followed by a post-exposure baking treatment to form a latent image of the pattern. Development of the latent image is performed by using an aqueous alkaline solution such as a 1 to 10% aqueous solution of tetramethylammonium hydroxide. In this way, an extremely fine patterned resist layer of high fidelity to the photomask pattern can be formed on a substrate surface with a fineness of 0.20 to 0.22 μm and a cross sectional profile of good orthogonality.

In the following, the positive-working chemical-amplification photoresist composition of the present invention is described in more detail by way of Examples. In the following description, the term of "parts" always refers to "parts by weight".

EXAMPLE 1

A positive-working photoresist composition was prepared by uniformly dissolving, in 800 parts of propyleneglycol monoethyl ether acetate, 60 parts of a first copolymeric resin, referred to as the resin I hereinafter, having a weight-average molecular weight of 10,000 and consisting of 65% by moles of hydroxystyrene units, 20% by moles of styrene units and 15% by moles of tert-butyl acrylate units, 40 parts of a second copolymeric resin, referred to as the resin II hereinafter, having a weight-average molecular weight of 10,000 and consisting of 65% by moles of hydroxystyrene units, 30% by moles of styrene units and 5% by moles of tert-butyl acrylate units, 3 parts of bis(4-tert-butylphenyl) iodonium nonafluorobutane sulfonate, 0.5 part of triethanolamine, and 0.5 part of salicylic acid, followed by filtration of the solution through a membrane filter of 0.2 μm pore diameter.

A semiconductor silicon wafer of 6 inches diameter after a treatment with hexamethyl disilazane was coated on a spinner with the above prepared photoresist solution followed by drying under heating on a hot plate at 130° C. for 90 seconds to give a dried photoresist layer having al thickness of 0.7 μm. In the next place, the photoresist layer was exposed pattern-wise to a KrF excimer laser beam on a minifying projection exposure machine (Model FPA-3000EX3, manufactured by Canon Co.) followed by a post-exposure baking treatment at 120° C. for 90 seconds and then by a puddle development treatment at 23° C. for 65 seconds in a 2.38% by weight aqueous solution of tetramethylammonium hydroxide to give a positively patterned resist layer.

A fully resolved line-and-space pattern of 0.22 μm line width could be obtained in this way. The thus patterned resist lines had an excellently orthogonal cross sectional profile standing upright on the substrate surface. The minimum exposure dose for obtaining the line-and-space resist pattern of 0.22 μm width was 30 mJ/cm$^2$ as a measure of the photosensitivity. The critical pattern resolution was 0.19 μm.

Comparative Example 1

The experimental procedure was substantially the same as in Example 1 excepting for modification of the formulation of the photoresist composition by replacing the combination of 60 parts of the resin I and 40 parts of the resin II with 100 parts of a third copolymeric resin having a weight-average molecular weight of 10,000 and consisting of 55% by moles of hydroxystyrene units, 20% by moles of styrene units and 25% by moles of tert-butyl acrylate units.

The results of the evaluation tests of the patterned resist layer were that line-and-space patterns of a line width smaller than 0.25 μm could not be obtained and the cross sectional profile of a line-patterned resist layer of 0.25 μm width was trapezoidal. The minimum exposure dose for obtaining the line-and-space pattern of 0.25 μm line width was 30 mJ/cm$^2$.

Comparative Example 2

The experimental procedure was substantially the same as in Example 1 excepting for modification of the formulation of the photoresist composition by replacing bis(4-tert-butylphenyl) iodonium nonafluorobutane sulfonate with the same amount of triphenylsulfonium trifluoromethane sulfonate.

The results of the evaluation tests of the patterned resist layer were that line-and-space patterns of a line width smaller than 0.25 μm could not be obtained and the cross sectional profile of a line-patterned resist layer of 0.25 μm width was trapezoidal. The minimum exposure dose for obtaining the line-and-space pattern of 0.25 μm line width was 25 mJ/cm$^2$. The critical pattern resolution was 0.24 μm.

EXAMPLE 2

The experimental procedure was substantially the same as in Example 1 excepting for modification of the formulation of the photoresist composition by increasing the amount of the resin I from 60 parts to 80 parts, decreasing the amount of the resin II from 40 parts to 20 parts and additional admixture of the composition with 2 parts of dimethylacetamide and for an increase of the pre-exposure baking temperature and post-exposure baking temperature from 130° C. to 140° C. and from 120° C. to 130° C., respectively.

The results of the evaluation tests of the patterned resist layer were that a hole pattern of 0.20 μm diameter could be obtained in this way. The thus formed hole pattern had an excellent cross sectional profile perpendicularly reaching the substrate surface. The minimum exposure dose for obtaining the hole pattern of 0.20 μm diameter was 40 mJ/cm$^2$ as a measure of the photosensitivity. The critical pattern resolution was 0.19 μm.

Comparative Example 3

The experimental procedure was substantially the same as in Example 2 excepting for modification of the formulation of the photoresist composition by replacing the combination of 80 parts of the resin I and 20 parts of the resin II with 100 parts of the third copolymeric resin as used in Comparative Example 1.

The results of the evaluation tests of the patterned resist layer were that hole patterns of 0.30 μm diameter or finer could not be obtained and the sensitivity for obtaining a 0.30 μm hole pattern was 40 mJ/cm$^2$.

Comparative Example 4

The experimental procedure was substantially the same as in Example 2 excepting for modification of the formulation of the photoresist composition by replacing bis(4-tert-butylphenyl) iodonium nonafluorobutane sulfonate with the same amount of triphenylsulfonium trifluoromethane sulfonate.

The results of the evaluation tests of the patterned resist layer were that hole patterns of 0.22 μm diameter or finer could not be obtained and the sensitivity for obtaining a 0.22 μm hole pattern, i.e. the minimum exposure dose, was 40 mJ/cm$^2$, although the cross sectional profile of the hole pattern was good perpendicularly reaching the substrate surface.

EXAMPLE 3

A positive-working photoresist composition was prepared by uniformly dissolving, in 730 parts of ethyl lactate,
- 60 parts of a first copolymeric resin having a weight-average molecular weight of 12,000 and consisting of 60% by moles of hydroxystyrene units, 25% by moles of styrene units and 15% by moles of tert-butyl acrylate units,
- 15 parts of a second copolymeric resin having a weight-average molecular weight of 12,000 and consisting of 70% by moles of hydroxystyrene units, 15% by moles of styrene units and 15% by moles of tert-butyl acrylate units,
- 10 parts of a third copolymeric resin having a weight-average molecular weight of 12,000 and consisting of 60% by moles of hydroxystyrene units, 35% by moles of styrene units and 5% by moles of tert-butyl acrylate units,
- 15 parts of a forth copolymeric resin having a weight-average molecular weight of 12,000 and consisting of 70% by moles of hydroxystyrene units, 25% by moles of styrene units and 5% by moles of tert-butyl acrylate units,
- 3.91 parts of bis(4-tert-butylphenyl) iodonium nonafluoro-butane sulfonate,
- 0.27 part of triethanolamine, and
- 0.29 part of phenylphosphonic acid,
- followed by filtration of the solution through a membrane filter of 0.2 μm pore diameter.

A silicon wafer having an antireflection coating film of 60 nm thickness formed by using an antireflection coating agent (AR 3-600, a product by Shipley Co.) was uniformly coated with the above prepared positive-working photoresist solution on a spinner followed by a pre-baking treatment on a hot plate at 140° C. for 90 seconds to form a photoresist layer of 0.45 μm thickness.

In the next place, the photoresist layer was exposed pattern-wise to a KrF excimer laser beam (248 nm) on a minifying projection exposure machine (Model FPA-3000EX-3, manufactured by Canon Co.) followed by a post-exposure baking treatment at 140° C. for 90 seconds and then by a puddle development treatment at 23° C. for 65 seconds in a 2.38% by weight aqueous solution of tetramethylammonium hydroxide to give a positively patterned resist layer.

A fully resolved line-and-space pattern of 150 nm line width could be obtained in this way. The minimum exposure dose for obtaining the line-and-space resist pattern of 150 nm width was 35 mJ/cm$^2$ as a measure of the photosensitivity. Fully resolved line-and-space patterns of 170 nm mask size could be obtained not only with a space to line ratio of 1:3 but also with the ratio of 1:2.5 as well indicating a small proximity effect.

Comparative Example 5

The experimental procedure was substantially the same as in Example 3 excepting for modification of the formulation of the photoresist composition by replacing 3.91 parts of bis(4-tert-butylphenyl) iodonium nonafluorobutane sulfonate with 3.18 parts of triphenylsulfonium nonafluorobutane sulfonate.

The results of the evaluation tests of the patterned resist layer were that line-and-space patterns of a line width smaller than 160 nm could not be obtained. The minimum exposure dose for obtaining the line-and-space pattern of 160 nm line width was 37 mJ/cm$^2$. A line-and-space pattern of 170 nm mask size with a space to line ratio of 1:2.5 could not be resolved, even though a line-and-space pattern with a space to line ratio of 1:3 could be well resolved, indicating a large proximity effect.

What is claimed is:

1. A positive-working chemical-amplification photoresist composition which comprises, as a uniform solution in an organic solvent:

(A) 100 parts by weight of a copolymeric resin consisting of from 50 to 85% by moles of (a) hydroxyl group-containing styrene units, from 15 to 35% by moles of (b) styrene units and from 2 to 20% by moles of (c) acrylate or methacrylate ester units each having a solubility-reducing group capable of being eliminated in the presence of an acid; and (B) from 1 to 20 parts by weight of a radiation-sensitive acid-generating agent which is an iodonium salt containing a nonafluorobutane sulfonate ion as the anion.

2. The positive-working chemical-amplification photoresist composition as claimed in claim 1 in which the solubility-reducing group capable of being eliminated in the presence of an acid is selected from the group consisting of tertiary alkyl groups, 1-alkoxyalkyl groups and acetal groups.

3. The positive-working chemical-amplification photoresist composition as claimed in claim 2 in which the tertiary alkyl group is tert-butyl group.

4. The positive-working chemical-amplification photoresist composition as claimed in claim 1 in which the copolymeric resin as the component (A) has a weight-average molecular weight in the range from 3000 to 30000.

5. The positive-working chemical-amplification photoresist composition as claimed in claim 1 which further comprises:

(C) an amine compound selected from the group consisting of secondary amines and tertiary amines in an amount in the range from 0.001 to 10 parts by weight per 100 parts by weight of the component (A).

6. The positive-working chemical-amplification photoresist composition as claimed in claim 5 in which the amine compound is a tertiary alkanolamine.

7. The positive-working chemical-amplification photoresist composition as claimed in claim 1 which further comprises:

(D) a carboxylic acid compound, a phosphorus-containing oxo acid compound or a derivative thereof in an amount in the range from 0.001 to 10 parts by weight per 100 parts by weight of the component (A).

8. The positive-working chemical-amplification photoresist composition as claimed in claim 7 in which the carboxylic acid compound is an aromatic carboxylic acid.

9. The positive-working chemical-amplification photoresist composition as claimed in claim 7 in which the phosphorus-containing oxo acid compound is phenylphosphonic acid.

10. The positive-working chemical-amplification photoresist composition as claimed in claim 1 which further comprises dimethylacetamide in an amount in the range from 0.1 to 5.0% by weight based on the amount of the component (A).

11. The positive-working chemical-amplification photoresist composition as claimed in claim 1 in which the hydroxyl group-containing styrene unit as the monomeric unit (a) in the component (A) is a hydroxystyrene unit.

* * * * *